United States Patent
Chan et al.

(10) Patent No.: US 7,545,185 B2
(45) Date of Patent: Jun. 9, 2009

(54) DUAL-MODE FREQUENCY DIVIDER

(75) Inventors: Yi-Jen Chan, Jhongli (TW); Fan-Hsiu Huang, Danshuel Township, Taipei County (TW); Dong-Ming Lin, Sijhou Township, Changhua County (TW)

(73) Assignee: National Central University, Taoyuan (TW)

( * ) Notice: Subject to any disclaimer, the term of this patent is extended or adjusted under 35 U.S.C. 154(b) by 223 days.

(21) Appl. No.: 11/363,034

(22) Filed: Feb. 28, 2006

(65) Prior Publication Data

US 2007/0139087 A1 Jun. 21, 2007

(30) Foreign Application Priority Data

Dec. 21, 2005 (TW) .............................. 94145433 A (51) Int. Cl.
*H03B 19/06* (2006.01)
(52) U.S. Cl. ..................... 327/118; 327/117; 327/202; 327/203
(58) Field of Classification Search ................ 327/115, 327/117, 118, 355–360, 202, 203, 208–212, 327/218, 113

See application file for complete search history.

(56) References Cited

U.S. PATENT DOCUMENTS

| 4,347,484 | A | | 8/1982 | Vandegraaf | 331/25 |
|---|---|---|---|---|---|
| 5,192,875 | A | | 3/1993 | Kielmeyer, Jr. | 307/219.1 |
| 6,087,865 | A | * | 7/2000 | Bradley | 327/117 |
| 6,166,571 | A | * | 12/2000 | Wang | 327/115 |
| 6,175,285 | B1 | | 1/2001 | Gabara | 331/117 |
| 6,249,192 | B1 | | 6/2001 | Gabara et al. | 331/117 |
| 6,831,489 | B2 | * | 12/2004 | Cheung et al. | 327/115 |
| 6,867,656 | B2 | | 3/2005 | Hajimiri | 331/45 |
| 2004/0066216 | A1 | * | 4/2004 | Spehar | 327/65 |
| 2007/0001719 | A1 | * | 1/2007 | Hulfachor et al. | 327/117 |

* cited by examiner

*Primary Examiner*—Kenneth B Wells
*Assistant Examiner*—John W Poos
(74) *Attorney, Agent, or Firm*—Troxell Law Office PLLC (57) ABSTRACT

The present invention improves a frequency divider circuit so that the frequency divider further obtains a capability of operating an injection-locking frequency division without changing or adding any component; and, the frequency divider operates under low voltage and low power consumption yet in high frequency, where the present invention can be use in related fields of radio frequency and optoelectronic communication.

10 Claims, 9 Drawing Sheets

|  | Prior art | Present invention |
|---|---|---|
| CMOS | 0.13m | 0.18m |
| Voltage | 2 volt | 1 volt |
| Power consumption | Injection-locking: 8mW (self-oscillation freq. of 2.5GHz, divisor of 2) Static: 10mW | Injection-locking: 4.3mW (self-oscillation freq. of 2.5GHz, divisor of 2) Static: 6mW |
| Static freq. range | 2.5GHz~12GHz | 2GHz~15GHz |
| Injection-locking freq. range | 20GHz (self-oscillation freq. of 2.5GHz, divisor of 8) | 20GHz (self-oscillation freq. of 2.5GHz, divisor of 8) |
| Minimum power | 1mW (300MHz free running) | 700uW (1.2GHz free running) |
| Adjustable self-oscillation freq. range | 3.3GHz~300MHz | 3.3GHz~100MHz |

DUAL-MODE FREQUENCY DIVIDER

FIELD OF THE INVENTION

The present invention relates to a frequency divider; more particularly, relates to operating a static frequency division and an injection-locking frequency division with the same circuit while lowering power consumption.

DESCRIPTION OF THE RELATED ARTS

General frequency dividers include static frequency dividers, dynamic frequency dividers and injection-locking frequency dividers, as what follows:

A. Static frequency divider: It has a differential structure of D-type flip-flop; requires an additional clock as a basic clock for a frequency division; has an operation speed depending on the equivalent loading capacitance of loads and transistors; has a capability of dividing frequency by 2 and a characteristic of wide frequency ranges for input/output frequency division; and, has a small circuit layout.

B. Dynamic frequency divider: It has a differential structure of T-type flip-flop; requires a feed back signal to be mixed with an input signal to run a division; consumes much power by a few transistors formed into stacks; and, is able to be operated in a wide band and a high frequency.

C. Injection-locking frequency divider: It has a basic oscillator structure, which is an inductor-capacitor (LC) tank structure or a ring structure with signals injected from an injection point; runs a frequency division under a phase synchronization of the injected signals and inner signals; has an operation frequency decided by an oscillator consuming low power and so is fitted for a circuit using low power; has characteristics of being big in put/output divisors and has a small frequency range for frequency division; and, has an operating frequency not high and a circuit layout quite large.

A prior art, "High frequency divider circuit", is proclaimed in Taiwan, which outputs a signal of frequency divided with multi-phases of a cycle according to the input signal. The prior art comprises an n-type serial ring magnifier circuit and a modulation current bias circuit. The modulation current bias circuit produces an alternating current having the same frequency as that of the input signal. The modulation current is injected into the serial ring magnifier circuit; and, a fixed oscillating frequency is obtained from the serial ring magnifier circuit. When the serial ring magnifier achieves a stable oscillating status, an output of the serial ring magnifier outputs a signal of dividing a cycle, and the output frequency is one out of N part of a referring frequency.

Another prior art, "Frequency Divider", is pro cl aimed in Taiwan, which comprises a frequency dividing member outputting a first clock and a second clock according to an input clock; a switching member outputting an output clock from the first clock when a switching signal of a first status for input appears, or from the second clock when a switching signal of a second status for output appears; and a switching control member outputting the switching signal of the first status or the second status and outputting the switching signal to the switching member according to the output clock of the switching member.

Although the above prior arts can divide a frequency, only a single mode can be run while a bigger power supply is consumed and a high speed operation is not achievable. Hence, the prior arts do not fulfill users' requests on actual use.

SUMMARY OF THE INVENTION

The main purpose of the present invention is to operate a static frequency division and an injection-locking frequency division with the same circuit using low voltage, and to improve frequency dividing speed with lower power consumption.

To achieve the above purpose, the present invention is a dual-mode frequency divider, comprising a differential input, a pair of latch circuits, an output buffer and a differential output, where each latch circuit comprises a pair of input transistors, a pair of flip-flop transistors and a pair of feedback-receiving transistors; and the differential input further comprises a DC controlling signal device inputting a DC controlling voltage to control a self-oscillating frequency of the latch circuit through a dynamic compensation. Accordingly, a novel dual-mode frequency divider is obtained.

BRIEF DESCRIPTIONS OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
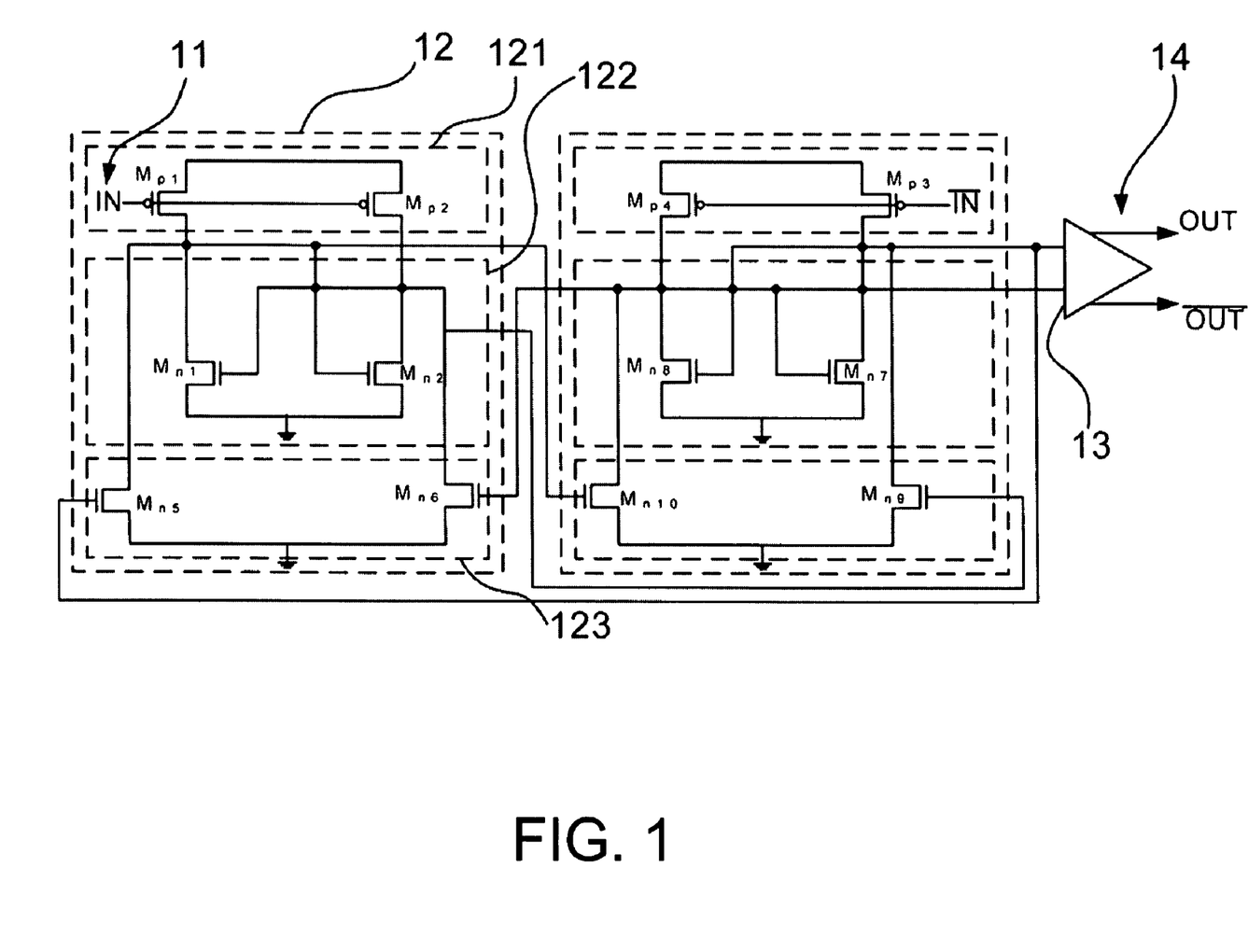
FIG. 1 is a structural view showing a preferred embodiment according to the present invention.

Please refer to FIG. 1, which is a structural view showing a preferred embodiment according to the present invention. As shown in the figure, the present invention is a dual-mode frequency divider, a frequency divider 1 used for a static frequency division and an injection-locking frequency division at the same time, comprising a differential input 11, a pair of latch circuit 12, an output buffer 13 and a differential output 14.

The differential input 11 inputs a differential alternating-current (AC) signal of a to-be-divided frequency; in the other hand, the differential output 14 outputs a magnified divided differential AC signal; and, the differential input 11 is a gate of a p-type metal-oxide semiconductor (MOS).

Each latch circuit 12 comprises a pair of input transistors 121 (Mp1 and Mp2, Mp3 and Mp4), a pair of flip-flop transistors 122 (Mn1 and Mn2, Mn7 and Mn8) and a pair of feedback-receiving transistors 123 (Mn5 and Mn6, Mn9 and Mn10), where the input transistor is a p-type MOS to receive an input of a differential AC signal; the flip-flop transistor 122 is an n-type MOS to obtain a first buffer signal from the differential AC signal with an inner switching signal; and the feedback-receiving transistor 123 is an n-type MOS to receive a second buffer signal from another latch circuit 12. The flip-flop transistor 122 is connected with the feedback-receiving transistor 123 in a parallel way and is stacked in each latch circuit 12. Hence, with the present invention, the static frequency division function is kept, the voltage supplied is lowered, the power consumed is reduced, and the frequency range for dividing is widened. The above statement concerns about a static frequency division; however, the latch circuit 12 can be regarded as a self-oscillating circuit to output a self-oscillating frequency when an injection-locking frequency division is operated.

The output buffer 13 is connected with an output of the latch circuit 12 to magnify a signal of a divided frequency obtained through a magnifying circuit selected from an emitter-coup led logic (ECL), a common mode logic (CML), a positive-ECL (PECL) and a low voltage differential signaling (LVDS).

Figure 2:
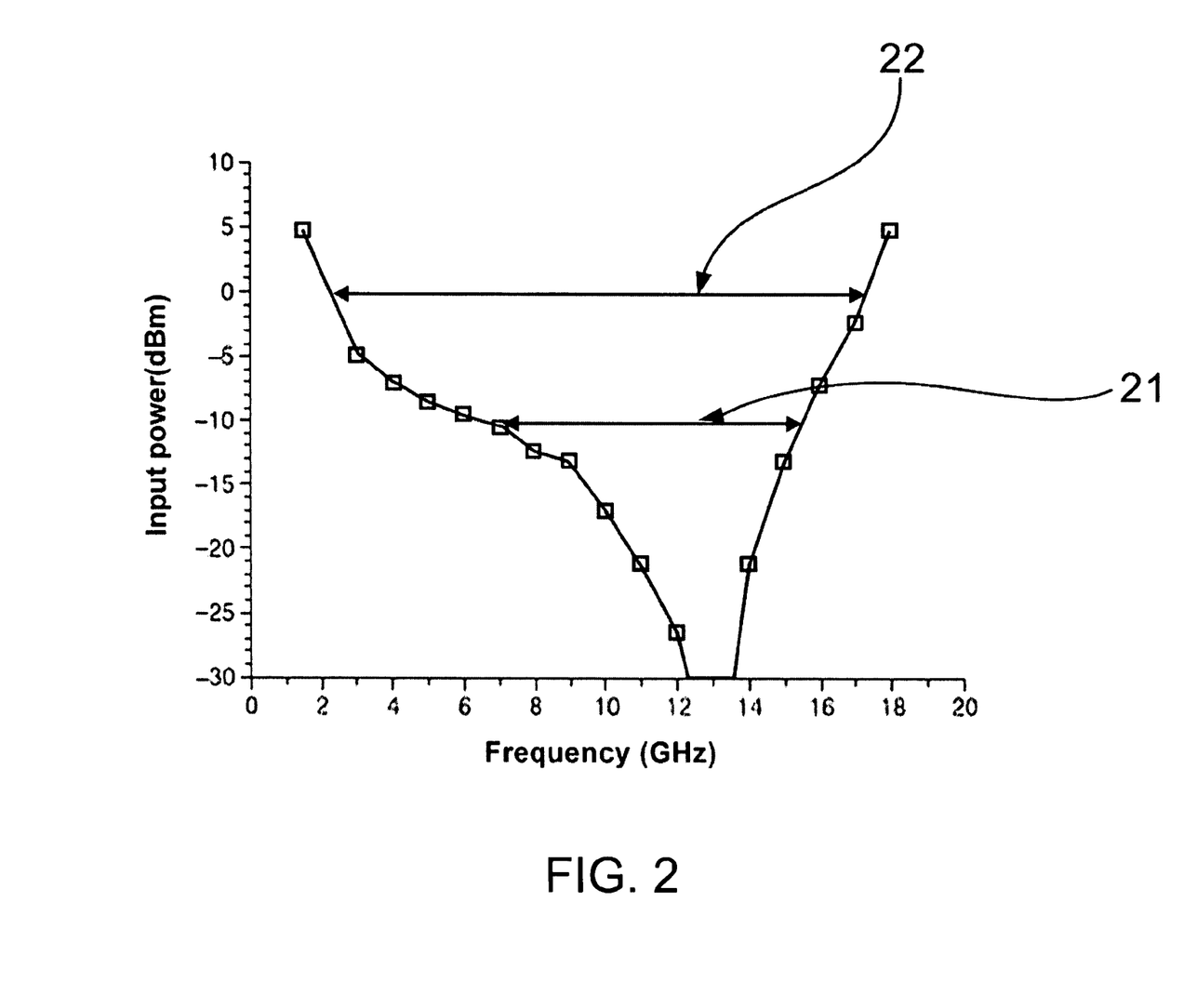
FIG. 2 is a view showing a relationship between input power and frequency range in a static frequency division according to the preferred embodiment of the present invention.

Please refer to FIG. 2, which is a view showing a relationship between input power and frequency range in a static frequency division according to the preferred embodiment of the present invention. When the frequency range of the differential AC input signal is enlarged, the power of the differential AC input signal has to be increased too for obtaining a divisor of 2. For example, when a first frequency range 21 of the differential AC in put signal is 8 GHz, the power of the differential AC input signal is –10 dBm; and, when a second frequency range 22 of the differential AC input signal is 15 GHz, the power of the differential AC input signal is 0 dBm.

Figure 3:
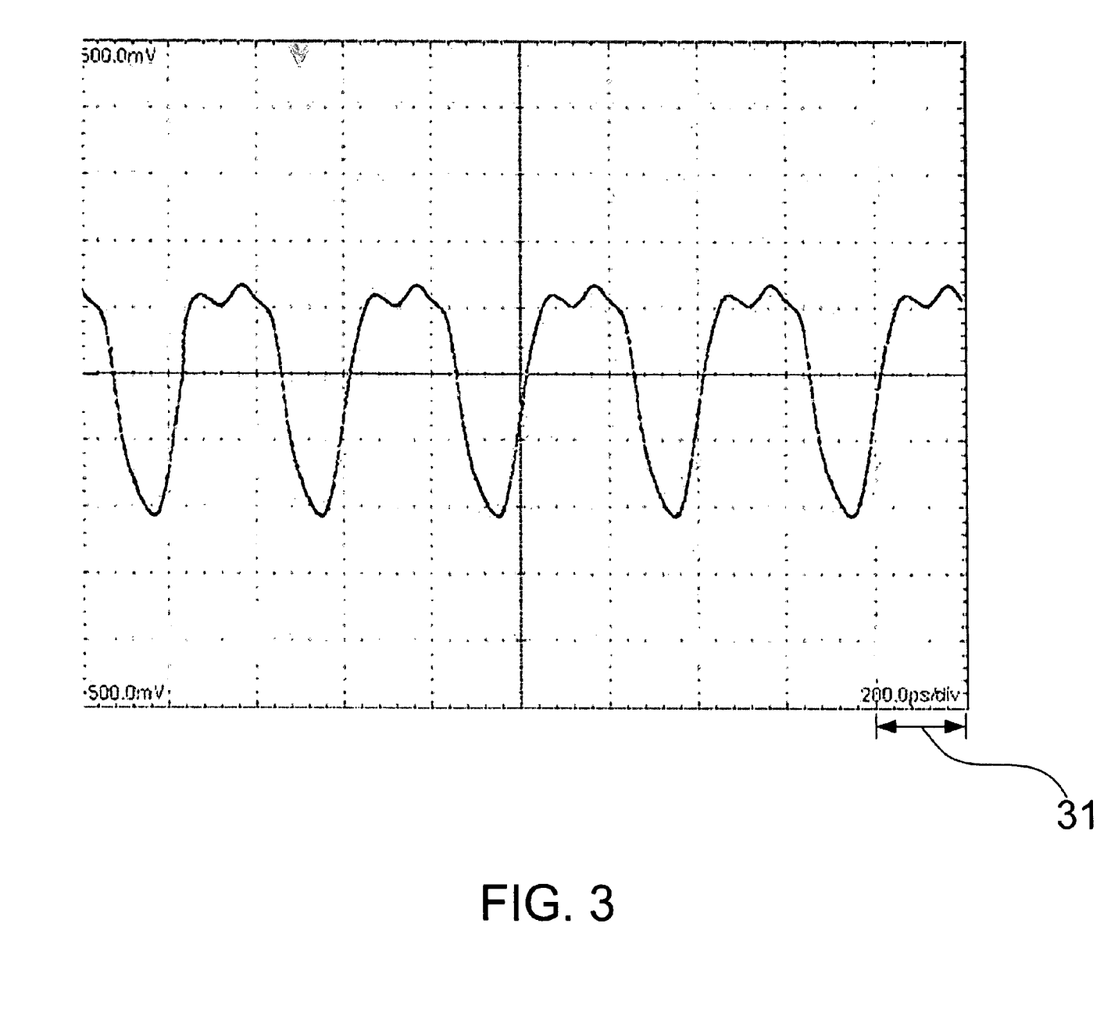
FIG. 3 is a view showing a wave of a divided frequency outputted through the static frequency division according to the preferred embodiment of the present invention.

Please refer to FIG. 3, which is a view showing a wave of a divided frequency outputted through the static frequency division according to the preferred embodiment of the present invention. As shown in the figure, when a differential AC signal of 5 GHz frequency is inputted for the static frequency division, a differential output signal of 2.5 GHz frequency is obtained. Therein, a grid in the view represents 200 ps, which means the output signal has a frequency cycle of 400 ps.

Figure 4A:
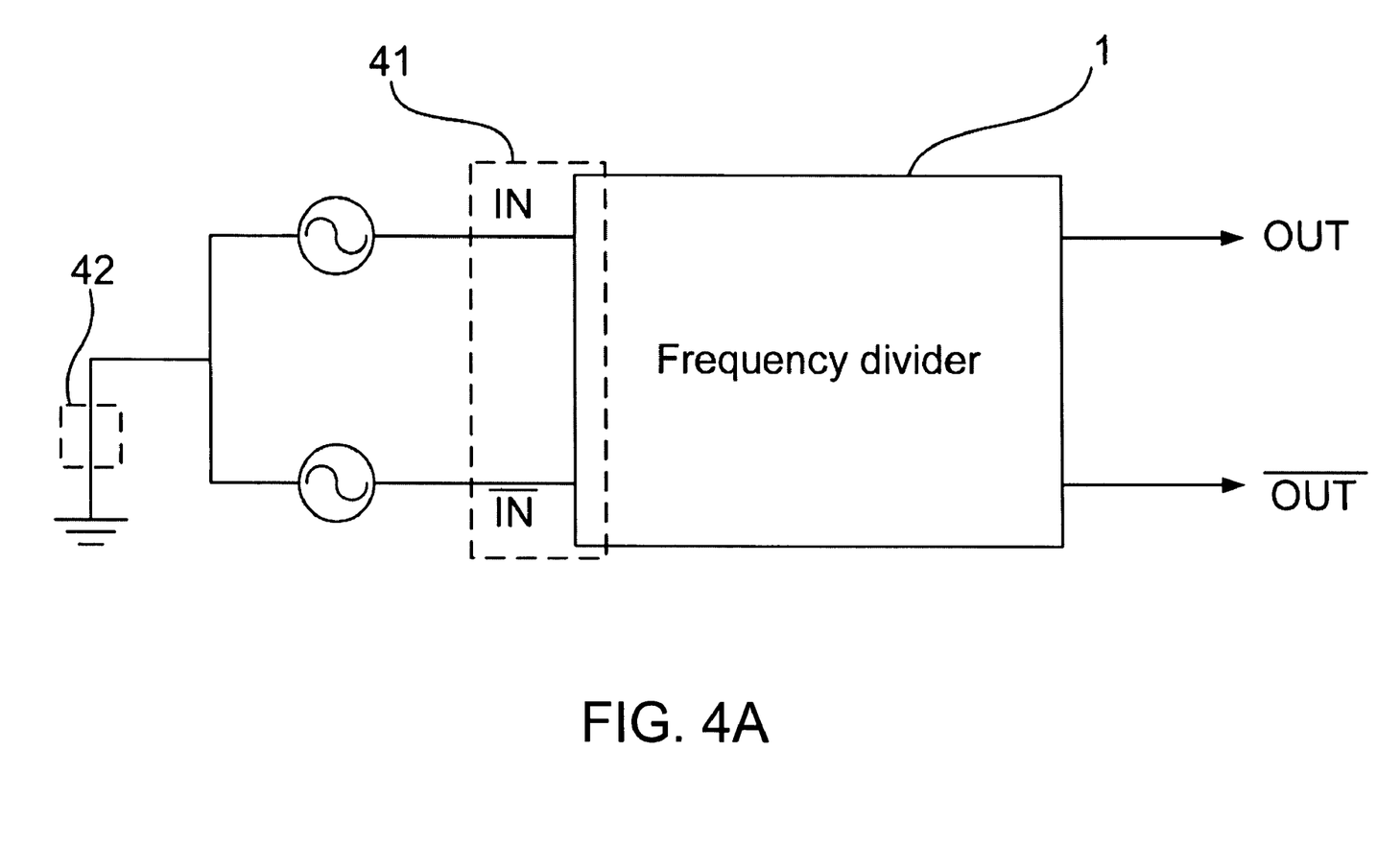
FIG. 4A is a view showing an inputting of a frequency signal for the static frequency division according to the preferred embodiment of the present invention.
Figure 4B:
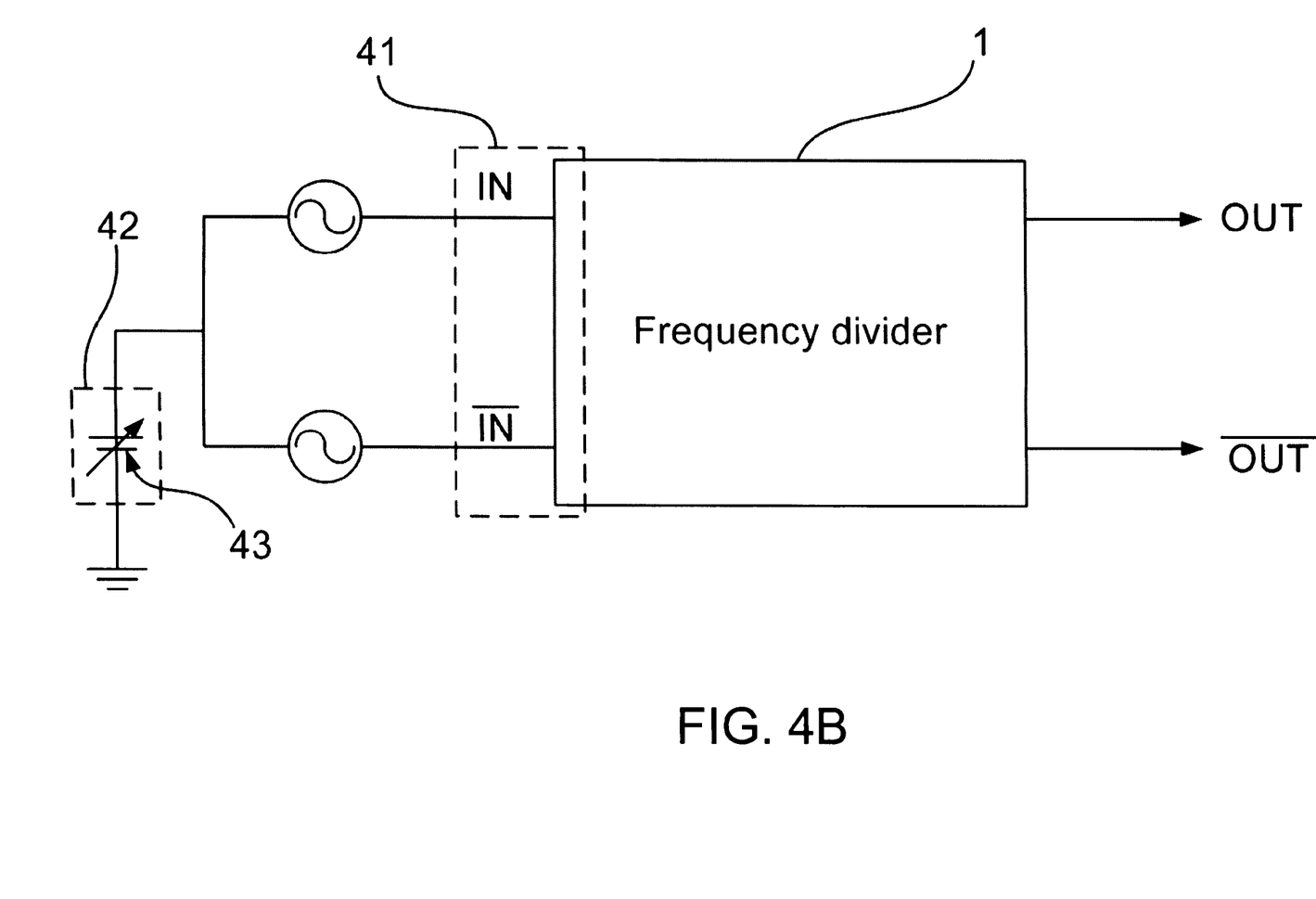
FIG. 4B is a view showing an inputting of a frequency signal for an injection-locking frequency division according to the preferred embodiment of the present invention.

Please refer to FIG. 4A and FIG. 4B, which are views showing input-ends of frequency signals for the static frequency division and an injection-locking frequency division according to the preferred embodiment of the present invention. As shown in the figures, a frequency divider 1 according to the present invention comprises functions used for the static frequency division and an injection-locking frequency division. Therein, a DC controlled signal device 42 is further set at the differential input 41. When the DC controlled signal device 42 inputs a differential AC signal 'without' an extra DC controlled voltage 43 added, the frequency divider 1 operates the static frequency division (as shown in FIG. 4A) and, when the DC controlled signal device 42 inputs a differential AC signal 'with' an extra DC controlled voltage 43 added, the frequency divider 1 operates an injection-locking frequency division (as shown in FIG. 4B).

Figure 5:
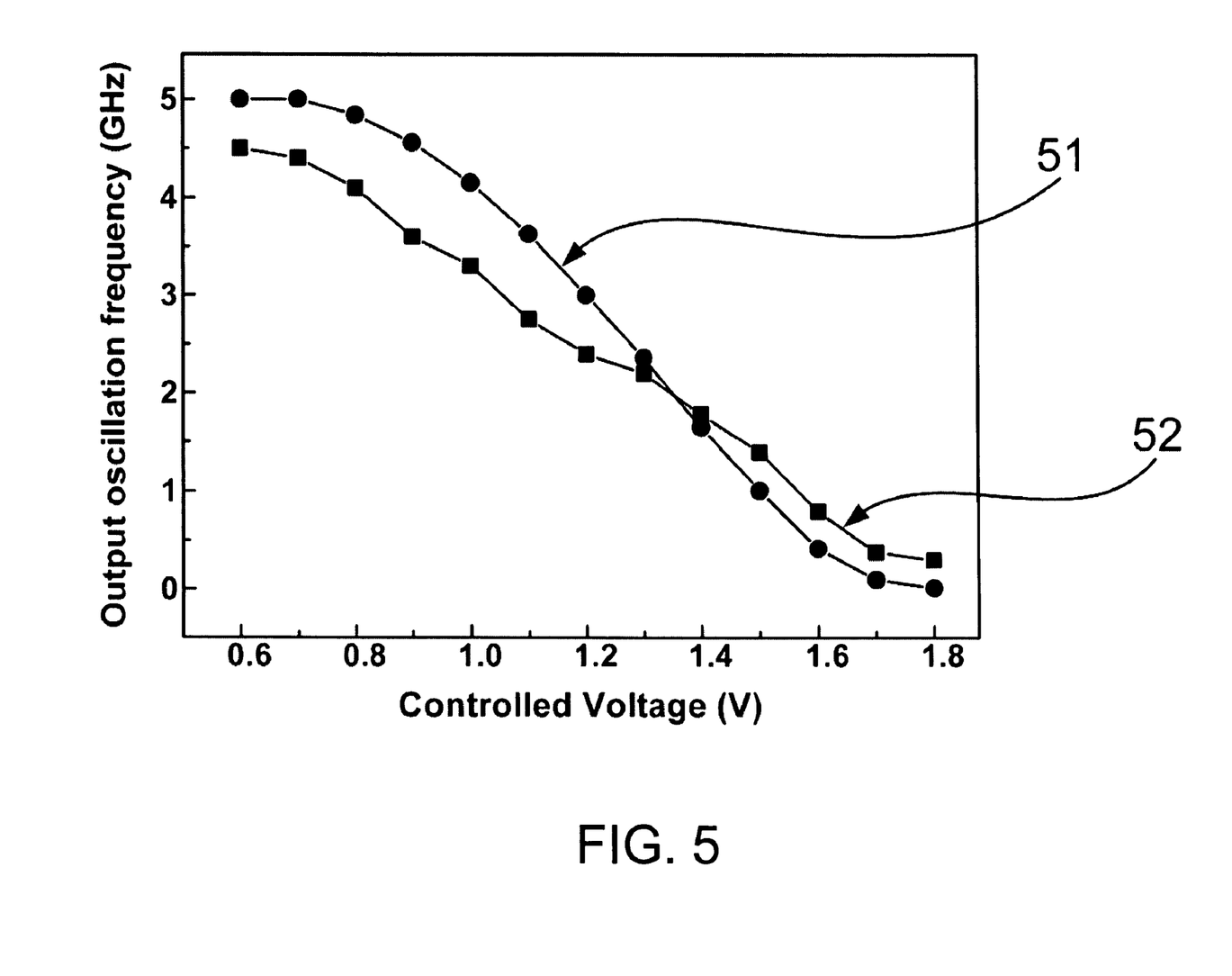
FIG. 5 is a view showing a relationship between DC controlling input voltage and DC controlling output voltage according to the preferred embodiment of the present invention.

Please refer to FIG. 5, which is a view showing a relationship between DC controlled input voltage and DC control led output voltage according to the preferred embodiment of the present invention. As shown in the figure, a simulation curve 51 and a measurement curve 52 are shown. Before a differential AC signal is inputted, a DC controlled voltage can be inputted first to obtain a self-oscillating frequency from a latch circuit within. Since the DC controlled voltage adjusts a bias status of the transistors in the latch circuit, the self-oscillating frequency is further adjusted.

Figure 6:
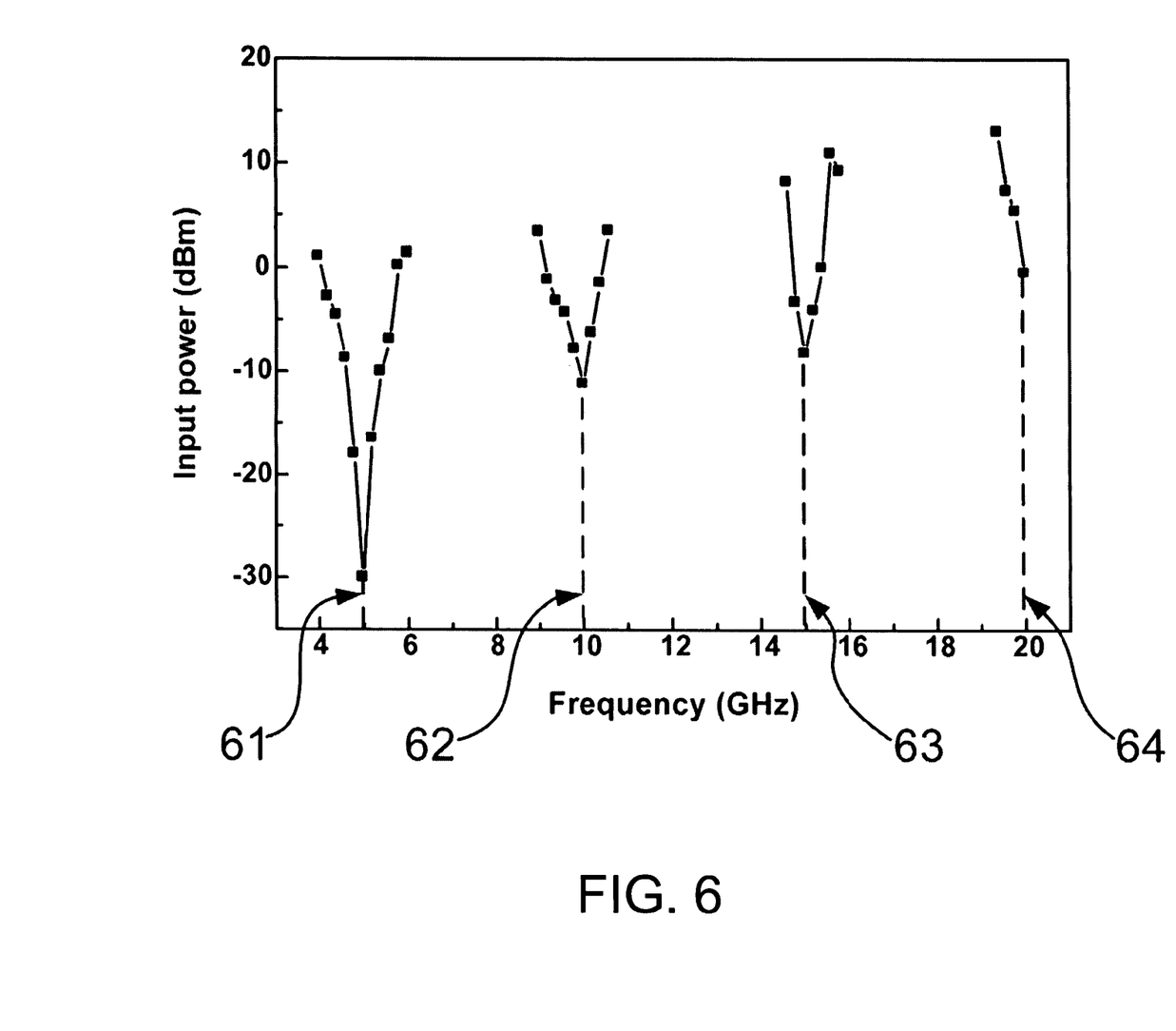
FIG. 6 is a view showing first output divisors according to the preferred embodiment of the present invention.

Please refer to FIG. 6, which is a view showing first output divisors according to the preferred embodiment of the present invention. As shown in the figure, under a fixed self-oscillating frequency of 2.5 GHz, when a first signal of 5 GHz frequency is inputted, an output divisor of 2 is obtained; when a first signal of 10 GHz frequency is inputted, an output divisor of 4 is obtained; when a second signal of 15 GHz frequency is inputted, an output divisor of 6 is obtained; and, when a first signal of 20 GHz frequency is inputted, an output divisor of 8 is obtained. Thus, in an injection-locking frequency division, when a differential AC signal of an even number times of a self-oscillating frequency is inputted and the differential AC input signals and output signals are synchronized, the frequencies of the output signals are the even number part of the input signals and output divisors of even numbers are obtained.

Figure 7:
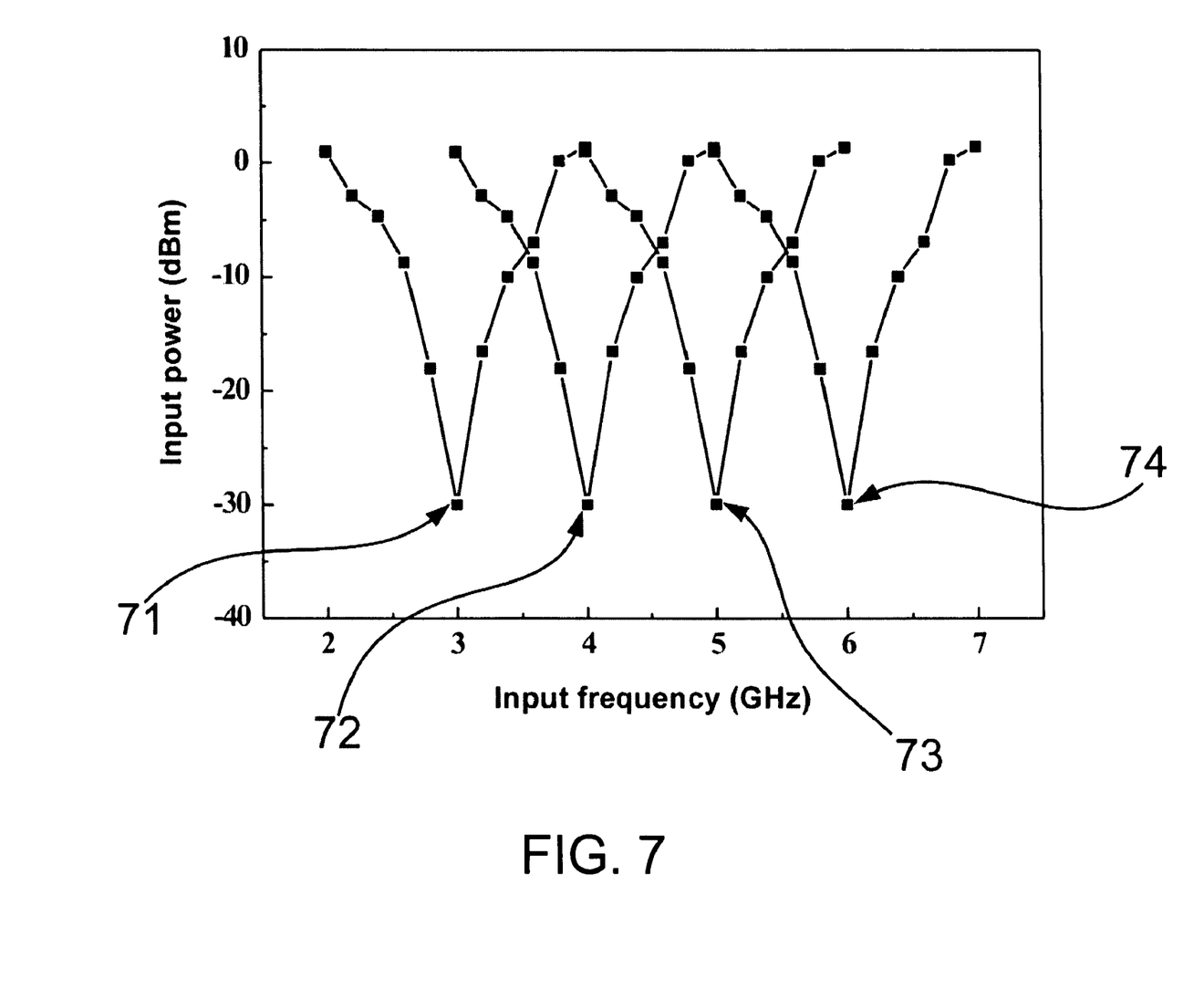
FIG. 7 is a view showing second output divisors according to the preferred embodiment of the present invention.

Please refer to FIG. 7, which is a view showing second output divisors according to the preferred embodiment of the present invention. As shown in the figure, a first 71, a second 72, a third 73 and a fourth 71 curves are shown, each of which has a divisor of 2. In the figure, a self-oscillating frequency of the first curve 71 is adjusted into 1.5 GHz to obtain an input signal of 3 GHz frequency; a self-oscillating frequency of the second curve 72 is adjusted into 2 GHz to obtain an input signal of 4 GHz frequency; a self-oscillating frequency of the third curve 73 is adjusted into 2.5 GHz to obtain an input signal of 5 GHz frequency; and, a self-oscillating frequency of the fourth curve 74 is adjusted into 3 GHz to obtain an in put signal of 6 GHz frequency. Here, by dynamic compensations to self-oscillating frequencies, frequency ranges of the input signals become wider than those in an original injection-locking frequency division according to the present invention. Thus, in an injection-locking frequency division done by the present invention, when the frequency of an differential AC input signal is biased from a self-oscillating frequency and so the frequency is not divided, a circuit providing a DC control led voltage can be used to adjust the self-oscillating frequency through a dynamic compensation so that the self-oscillating frequency becomes an even number part of the frequency of the input signal and the frequency range of the input signal is further widened.

Figure 8:
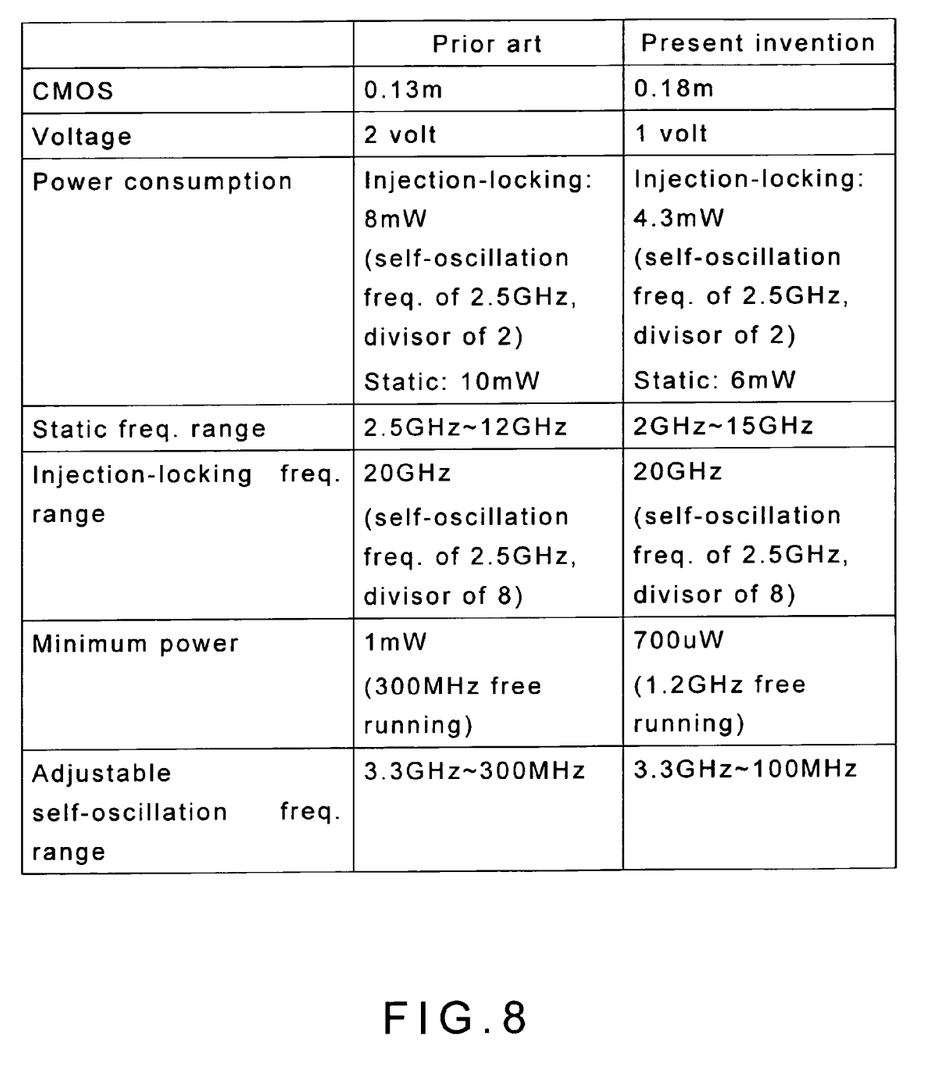
FIG. 8 is a view showing a comparison between a prior art and the preferred embodiment of the present invention.

Please refer to FIG. 8, which is a view showing a comparison between a prior art and the preferred embodiment of the present invention. As shown in the figure, the voltage supplied for the present invention is lower than that for the prior art; no matter in a static frequency division or in an injection-locking frequency division; power consumption is improved; and, the frequency range of the divided frequency is wider than that in the prior art. Hence, the frequency divider of the present invention has a better frequency operating speed. In addition, the self-oscillating frequency of the present invention can be adjusted in a wider range so that the dynamic frequency range of input signal and the output divisor have wider operation possibilities.

To sum up, the present invention is a dual-mode frequency divider, where a frequency is divided under a low voltage; a frequency dividing speed is improved; a power consumption is reduced and a dual-mode operation, containing a static and an injection-locking frequency divisions, is obtained.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A dual-mode frequency divider, comprising:
   (a) a differential input inputting a signal of a to-be-divided frequency;
   (b) a pair of latch circuits, each said latch circuit comprising a plurality of transistors, said plurality of transistors comprising a pair of input transistors, a pair of flip-flop transistors and a pair of feedback-receiving transistors, wherein said input transistor receives said signal of said to-be-divided frequency from said differential input, said flip-flop transistor obtains a first buffer signal by processing said signal of said to-be-divided frequency together with an inner switching signal, and said feedback-receiving transistor receives a second buffer signal from another latch circuit;
   (c) an output buffer connecting to an output of said pair of latch circuits, said output buffer magnifying a signal of a divided frequency obtained from said pair of latch circuits through a magnifying circuit; and
   (d) a differential output outputting said signal of said divided frequency,
   wherein an output divisor of an even number is obtained from said signal of said to-be-divided frequency through said latch circuit,
   wherein a power of said signal of said to-be-divided frequency is increased to widen a frequency range of said signal of said to-be-divided frequency and to obtain said output divisor of said even number,
   wherein the dual-mode frequency divider is configured to have two selectable operation modes comprising a static operation mode and an injection-locking operation mode,
   wherein said differential input further comprises a DC controlling signal device.

2. The frequency divider according to claim 1, wherein said output buffer is selected from a group consisting of an emitter-coupled logic (ECL), a common mode logic (CML) a positive-ECL (PECL), and a low voltage differential signaling (LVDS).

3. The frequency divider according to claim 1, wherein said signal of said to-be-divided frequency is a signal of a wave selected from a group consisting of a sine wave and a square wave.

4. The frequency divider according to claim 1, wherein said differential input is a gate of a p-type metal-oxide semiconductor (MOS).

5. The frequency divider according to claim 1, wherein every said transistor in said pair of said latch circuits is a MOS.

6. The frequency divider according to claim 1, wherein each said latch circuit comprises at least a p-type MOS and at least an n-type MOS.

7. The frequency divider according to claim 1, wherein said DC control led signal device inputs a signal of a to-be-divided frequency and said signal of said to-be-divided frequency has a frequency of an even number times of a self-oscillating frequency.

8. The frequency divider according to claim 7, wherein said DC control led signal device inputs a DC controlling voltage to output a self-oscillating frequency before inputting said signal of said to-be-divided frequency.

9. A dual-mode frequency divider, comprising:
   (a) a differential input inputting a signal of a to-be-divided frequency;
   (b) a pair of latch circuits, each said latch circuit comprising a plurality of transistors, said plurality of transistors comprising a pair of input transistors, a pair of flip-flop transistors and a pair of feedback-receiving transistors, wherein said input transistor receives said signal of said to-be-divided frequency from said differential input, said flip-flop transistor obtains a first buffer signal by processing said signal of said to-be-divided frequency together with an inner switching signal, and said feedback-receiving transistor receives a second buffer signal from another latch circuit;
   (c) an output buffer connecting to an output of said pair of latch circuits, said output buffer magnifying a signal of a divided frequency obtained from said pair of latch circuits through a magnifying circuit; and
   (d) a differential output outputting said signal of said divided frequency,
   wherein said differential input further comprises a DC controlling signal device,
   wherein said DC control led signal device inputs a signal of a to-be-divided frequency and said signal of said to-be-divided frequency has a frequency of an even number times of a self-oscillating frequency,
   wherein said DC control led signal device inputs a DC controlling voltage to output a self-oscillating frequency before inputting said signal of said to-be-divided frequency,
   wherein the dual-mode frequency divider is configured to have two selectable operation modes comprising a static operation mode and an injection-locking operation mode.

10. A dual-mode frequency divider, comprising:
   (a) a differential input inputting a signal of a to-be-divided frequency;
   (b) a pair of latch circuits, each said latch circuit comprising a plurality of transistors, said plurality of transistors comprising a pair of input transistors, a pair of flip-flop transistors and a pair of feedback-receiving transistors, wherein said input transistor receives said signal of said to-be-divided frequency from said differential input, said flip-flop transistor obtains a first buffer signal by processing said signal of said to-be-divided frequency together with an inner switching signal, and said feedback-receiving transistor receives a second buffer signal from another latch circuit;
   (c) an output buffer connecting to an output of said pair of latch circuits, said output buffer magnifying a signal of a divided frequency obtained from said pair of latch circuits through a magnifying circuit; and
   (d) a differential output outputting said signal of said divided frequency,
   wherein an output divisor of an even number is obtained from said signal of said to-be-divided frequency through said latch circuit, wherein a power of said signal of said to-be-divided frequency is increased to widen a frequency range of said signal of said to-be-divided frequency and to obtain said output divisor of said even number, wherein the dual-mode frequency divider is configured to have two selectable operation modes comprising a static operation mode and an injection-locking operation mode, wherein said to-be-divided frequency is divided by using a direct-current (DC) controlling signal device to obtain said output divisor of said even number; and wherein said DC controlling signal device obtains a self-oscillating frequency of said even number part of said to-be-divided frequency.

* * * * *